(12) United States Patent
Chang et al.

(10) Patent No.: US 11,751,380 B2
(45) Date of Patent: Sep. 5, 2023

(54) SEMICONDUCTOR MEMORY STRUCTURE (71) Applicant: Winbond Electronics Corp., Taichung (TW)

(72) Inventors: Hao-Chuan Chang, Taichung (TW); Jiun-Sheng Yang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 134 days.

(21) Appl. No.: 17/412,992

(22) Filed: Aug. 26, 2021

(65) Prior Publication Data

US 2022/0293606 A1 Sep. 15, 2022

(30) Foreign Application Priority Data

Mar. 10, 2021 (TW) .................................. 110108581

(51) Int. Cl.
*H10B 12/00* (2023.01)
(52) U.S. Cl.
CPC ....... *H10B 12/315* (2023.02); *H10B 12/0335* (2023.02); *H10B 12/482* (2023.02)
(58) Field of Classification Search
CPC ............................. H10B 12/0035; H10B 12/00
See application file for complete search history.

(56) References Cited

U.S. PATENT DOCUMENTS 10,312,247 B1 6/2019 Jourba
2015/0035050 A1* 2/2015 Yeom ................. H01L 21/32133
257/532

FOREIGN PATENT DOCUMENTS

KR 20070109113 A 11/2007

* cited by examiner

*Primary Examiner* — Robert G Bachner
*Assistant Examiner* — Molly K Reida
(74) *Attorney, Agent, or Firm* — Muncy, Geissler, Olds & Lowe, P.C.

(57) ABSTRACT

A semiconductor memory structure includes a semiconductor substrate, a bit line disposed on the semiconductor substrate, and a capacitor contact disposed on the side of the bit line. The capacitor contact includes a semiconductor plug disposed on the semiconductor substrate, a metal plug disposed on the semiconductor plug, a metal silicide liner extending along the sidewalls and bottom of the metal plug, and a nitride layer disposed on the metal silicide liner. The top surface of the metal silicide liner is lower than the top surface of the metal plug. The nitride layer surrounds the top portion of the metal plug.

20 Claims, 9 Drawing Sheets

SEMICONDUCTOR MEMORY STRUCTURE

CROSS REFERENCE TO RELATED APPLICATIONS

This application claims priority of Taiwan Patent Application No. 110108581, filed on Mar. 10, 2021, the entirety of which is incorporated by reference herein.

TECHNICAL FIELD

The present disclosure relates to a semiconductor memory structure, and particularly it relates to a contact structure of a dynamic random-access memory.

DESCRIPTION OF THE RELATED ART

In recent years, dynamic random access memory (DRAM) has been widely used in consumer electronic products. In order to increase the density of elements in DRAM and improve its performance, the current fabrication technique of the DRAM continues to work toward a scaling-down size of the elements.

However, as the elements continue to shrink, many challenges arise. For example, in the semiconductor fabrication process, because the contact area of a semiconductor plug and a metal plug is small, higher capacitance is generated between the bit lines. Therefore, the industry still needs to improve the structure and method for dynamic random access memory in order to overcome the problems caused by scaling down the elements.

BRIEF SUMMARY

In accordance with some embodiments of the present disclosure, a semiconductor memory structure is provided. The semiconductor memory structure includes a semiconductor substrate, a bit line disposed on the semiconductor substrate, and a capacitor contact disposed on a side of the bit line. The capacitor contact includes a semiconductor plug on the semiconductor substrate, a metal plug disposed on the semiconductor plug, a metal silicide liner extending along sidewalls and a bottom of the metal plug, and a nitride layer disposed on the metal silicide liner. A top surface of the metal silicide liner is lower than a top surface of the metal plug. The nitride layer surrounds a top portion of the metal plug.

DETAILED DESCRIPTION

Figure 1:
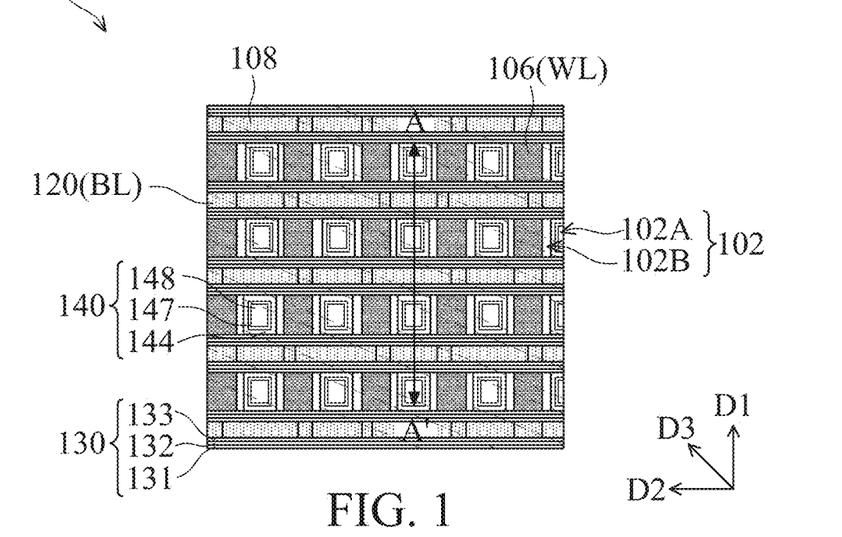
FIGS. 1, 12 and 15 illustrate top views of semiconductor memory structures at various stages according to some embodiments of the present disclosure.

FIG. 1 illustrates a top view of a semiconductor memory structure 100 according to some embodiments of the present disclosure. In some embodiments, the semiconductor memory structure 100 is a portion of dynamic random access memory array. The semiconductor memory structure 100 includes a semiconductor substrate 102, a word line 106, a bit line contact 108, a bit line 120, a dielectric liner 130, and a capacitor contact 140.

The semiconductor substrate 102 includes an active region 102A and an isolation region 102B surrounding the active region 102A. The dielectric liner 130 includes a pair of nitride liners 131 and 133 and an oxide liner 132 sandwiched between the nitride liners 131 and 133. The capacitor contact includes a metal plug 144 and an adhesive layer 147 and a nitride layer 148 both surrounding the metal plug 144. It should be noted that only some of the elements of a DRAM are illustrated in FIG. 1 for brevity.

The word line 106 extends in a first direction D1, the bit line 120 extends in a second direction D2, and the active region 102A extends in a third direction D3. The first direction D1 is perpendicular to the second direction D2, and the third direction D3 (that is, the extending direction of the active area 102A) and the second direction D2 form an angle of about 10°-40° (e.g. 20°), so as to increase the degree of integration of the elements.

The subsequent figures are cross-sectional views (planes formed by the first direction D1 and a height direction Z) taken along cross-sectional line A-A' in FIG. 1 in order to facilitate describing the methods for forming the semiconductor memory structure.

FIGS. 2-11 illustrate cross-sectional views of semiconductor memory structures at various stages according to some embodiments of the present disclosure.

Figure 2:
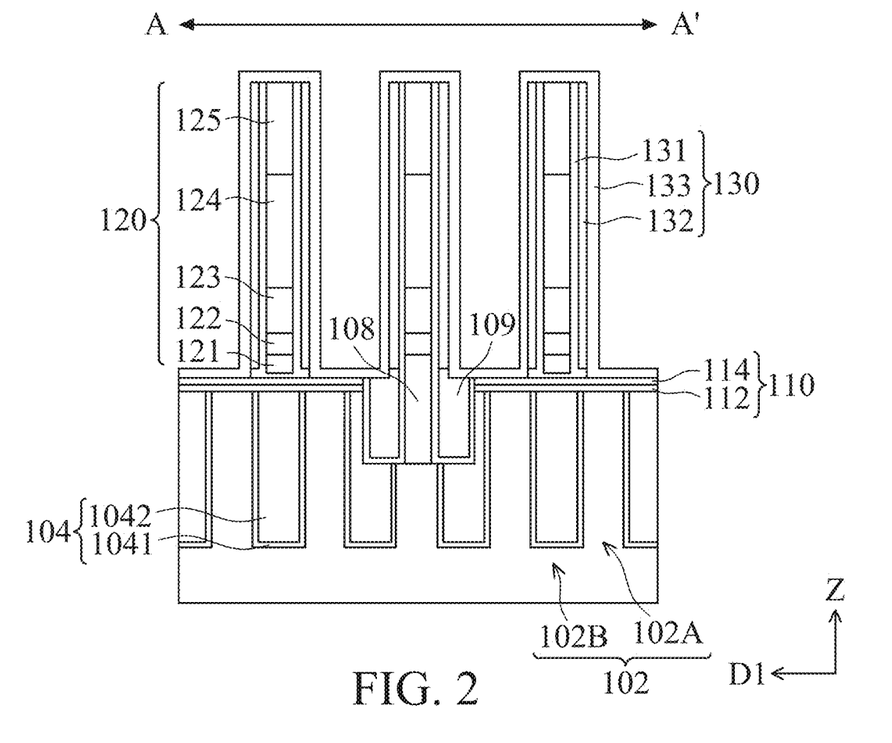
FIGS. 2-11, 13-14 and 16-18 illustrate cross-sectional views of semiconductor memory structures at various stages according to some embodiments of the present disclosure.

As shown in FIG. 2, the semiconductor substrate 102 is provided. The semiconductor substrate 102 may be an elemental semiconductor substrate, such as a silicon substrate or a germanium substrate; a compound semiconductor substrate, such as a silicon carbide substrate or a gallium arsenide substrate, or the like. In some embodiments, the semiconductor substrate 102 may be a semiconductor-on-insulator (SOI) substrate.

In FIG. 2, the semiconductor substrate 102 includes the active region 102A and the isolation region 102B, which are arranged alternately.

In FIG. 2, an isolation feature 104, which includes an isolation liner 1041 and an isolation filler 1042, is disposed in the isolation region 102B of the semiconductor substrate 102.

In some embodiments, the isolation liner 1041 and the isolation filler 1042 may include nitride or oxide, such as silicon oxide (SiO), silicon nitride (SiN), silicon oxynitride (SiON), and/or a combination thereof. The formation of the isolation liner 1041 and the isolation filler 1042 may include a patterning process (such as a lithography process and an etching process), a deposition process (such as chemical vapor deposition (CVD)), and a planarization process (such as chemical mechanical polishing (CMP)).

The word line (not shown) is embedded in the active region of the semiconductor substrate. In some embodiments, the word line serves as a gate, which includes a gate dielectric layer, a gate liner, and a gate electrode (not shown). It should be noted that the word line extends along the first direction D1 and the cross-sectional line A-A' does not contact the word line 106 in FIG. 1, thus the word line is not shown in FIG. 2.

In FIG. 2, the bit line contact 108 is partially embedded in the active region 102A of the semiconductor substrate 102 in order to facilitate electrically connection with the bit line 120 subsequently. In some embodiments, spacers 109 are disposed on opposite sides of the bit line contact 108 to prevent the bit line contact from connecting with the subsequently formed capacitor contact thereby short-circuited.

The bit line contact 108 includes conductive materials, which includes doped polycrystalline silicon, metal, or metal nitride, or the like. The formation of the bit line contact 108 includes the deposition process and the patterning process mentioned above.

The bit line contact 108 includes doped crystalline silicon in order to reduce the contact resistance with the subsequently formed bit line. The dopant may include n-type or p-type dopant, such as nitrogen, arsenic, phosphorous, antimony ions or boron, aluminum, gallium, indium, and boron trifluoride ions ($BF^{3+}$).

The spacers 109 include dielectric materials, which include nitride, such as silicon nitride. The formation of the spacers 109 may include the deposition process and the etching process mentioned above.

Still referring to FIG. 2, a cap layer 110 is formed on the semiconductor substrate 102 to protect elements within the semiconductor substrate from being damaged or affected by the subsequent process. In some embodiments, the cap layer 110 includes an oxide layer 112 and a nitride layer 114.

The oxide layer 112 includes a silicon oxide layer formed of tetraethylorthosilicate (TEOS). The nitride layer 114 includes silicon nitride (SiN) or silicon oxynitride (SiON). The oxide layer 112 and the nitride layer 114 are sequentially formed in the deposition process mentioned above.

Next, as shown in FIG. 2, the bit line 120 is formed on the semiconductor substrate 102. More particularly, the bit line 120 is formed on the bit line contact 108. The bit line 120 on the bit line contact 108 includes conductive layers 122 and 123, and dielectric layers 124 and 125 on the conductive layers 122 and 123. On the other hand, the bit line 120 on the isolation feature 104 includes a dielectric layer 121, conductive layers 122 and 123 on the dielectric layer 121, and dielectric layers 124 and 125 on the conductive layers 122 and 123. The topmost dielectric layers 144 and 145 may be used to protect films underneath (such as the conductive layers 122 and 123) from being damaged by the subsequent process.

The conductive layers 122 and 123 include doped crystalline silicon, metal, metal nitride, such as tungsten (W), titanium (Ti), and titanium nitride (TiN), and the like. In some embodiments, the dielectric layers 121, 124, and 125 include nitride or oxide, such as silicon nitride or silicon oxide.

The formation of the bit line 120 includes deposition process and the patterning process mentioned above.

Next, as shown in FIG. 2, the dielectric liner 130 is formed on opposite sides of the sidewalls and the top surface of the bit line 120 and on the top surface of the cap layer 110, thereby preventing the bit line 120 from coming into direct contact with subsequently formed capacitor contacts and thus short-circuiting.

The dielectric liner 130 on the opposite sidewalls of the bit line 120 includes nitride liners 131 and 133 and an oxide liner 132 sandwiched therebetween. In this way, parasitic capacitance between the bit line 120 and the subsequently formed capacitor contact is prevented from generating. In an alternative embodiment, the oxide liner 132 may be also replaced by an air gap.

The dielectric liner 130 on the top surface of the bit line 120 and the cap layer 110 includes only the nitride liner 133 to protect films underneath from being affected by subsequent processing.

The nitride liner 131 and the oxide liner 132 are first deposited in the deposition process, the nitride liner 131 and the oxide liner 132 on the top surface of the bit line 120 and on the top surface of the cap layer 110 are removed by the etching back process, and the nitride liner 133 is finally deposited in the deposition process. In this way, the oxide liner 132 may be sandwiched between the nitride liners 131 and 133.

Next, FIGS. 3-11 illustrate cross-sectional views for forming the capacitor contact 140 on the side of the bit line 120 at various stages according to some embodiments of the present disclosure.

Figure 3:
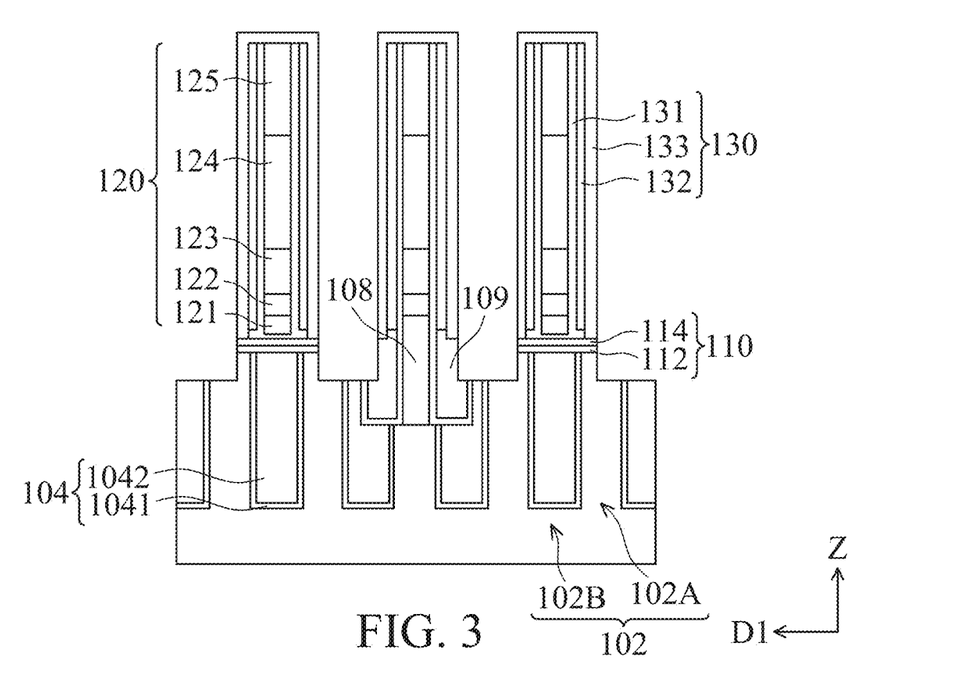

As shown in FIG. 3, the cap layer 110 and the semiconductor substrate 102 are recessed (including etching a portion of the spacer 109) along the sidewalls of the dielectric liner 130 by the etching back process. In this way, the subsequently formed capacitor and the active region 102A of the semiconductor substrate 102 are electrically connected.

Figure 4:
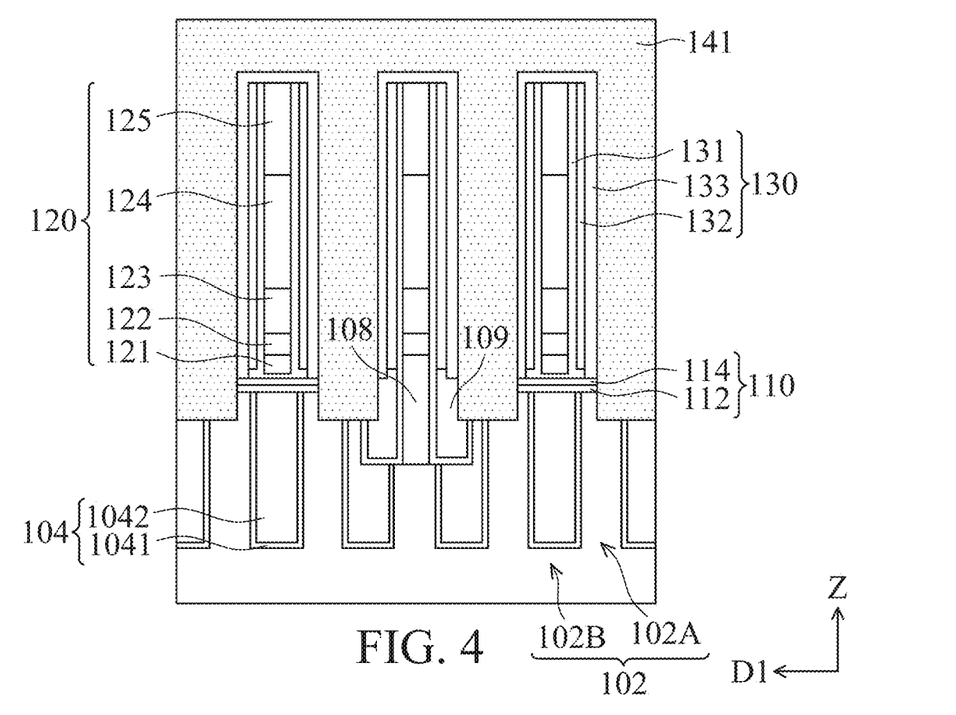
Figure 5:
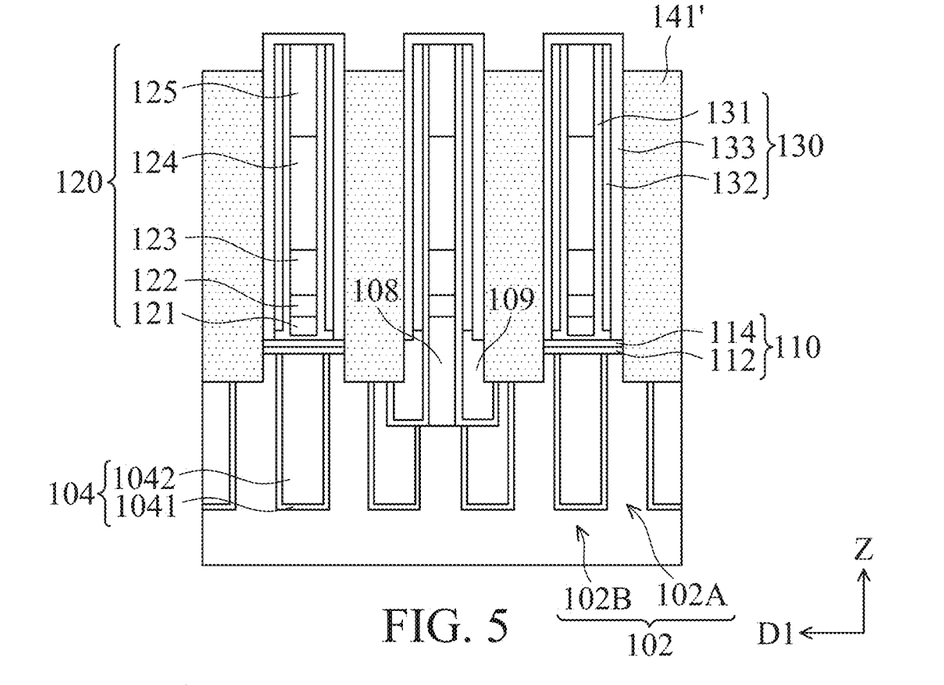

Next, as shown in FIGS. 4-5, the semiconductor material 141 is deposited in the deposition process, and then etched by the etching back process, so that the top surface of the semiconductor material 141' is lower than the top surface of the bit line 120. The semiconductor material 141 includes doped polycrystalline silicon.

Figure 6:
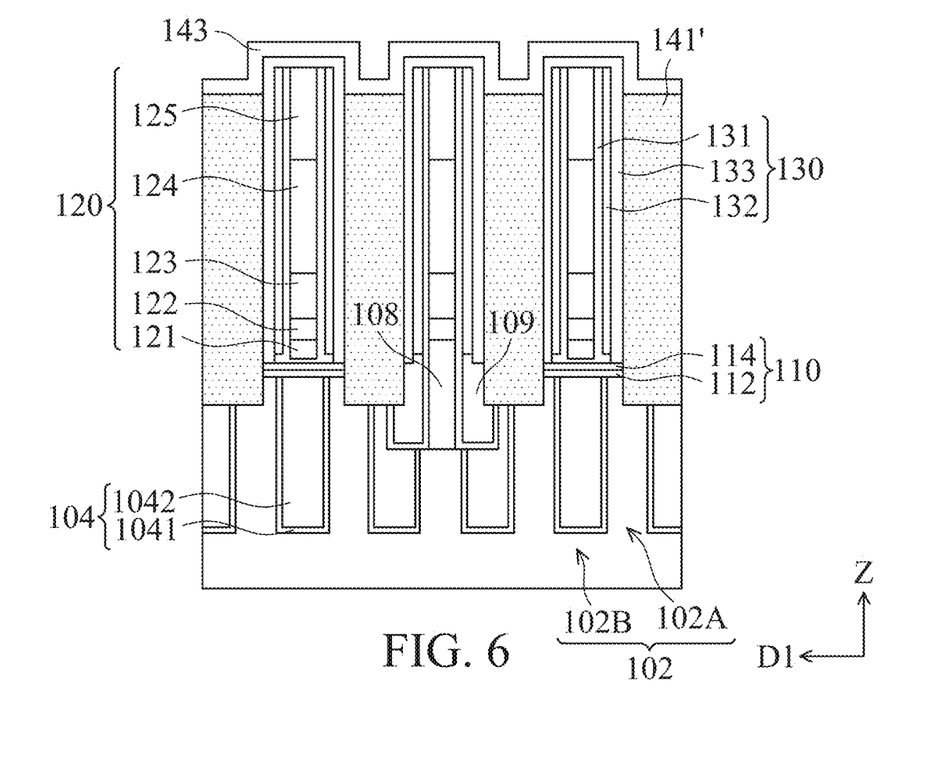
Figure 7:
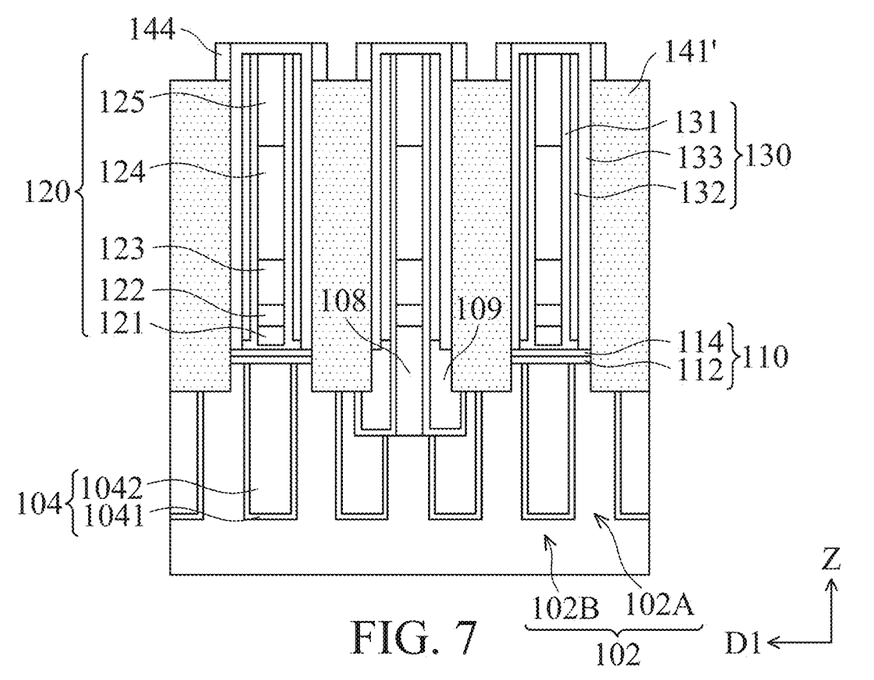

Next, as shown in FIGS. 6-7, the nitride material layer 143 is conformally deposited in the deposition process. Then, the nitride material layer 143 on the top surface of the semiconductor material 141' and on the top surface of the dielectric liner 130 is etched by the etching process until the top surface of the semiconductor material 141' is exposed, and the nitride layer 144 on the opposite side of the bit line 120 remains.

The top surface of the nitride layer 144 is level with the top surface of the dielectric liner 130, so that the nitride layer 144 has a finer pattern, which facilitates defining metal silicide liner subsequently. In addition, the sidewall of the nitride layer 144 is in direct contact with sidewalls of the dielectric liner 130.

Figure 8:
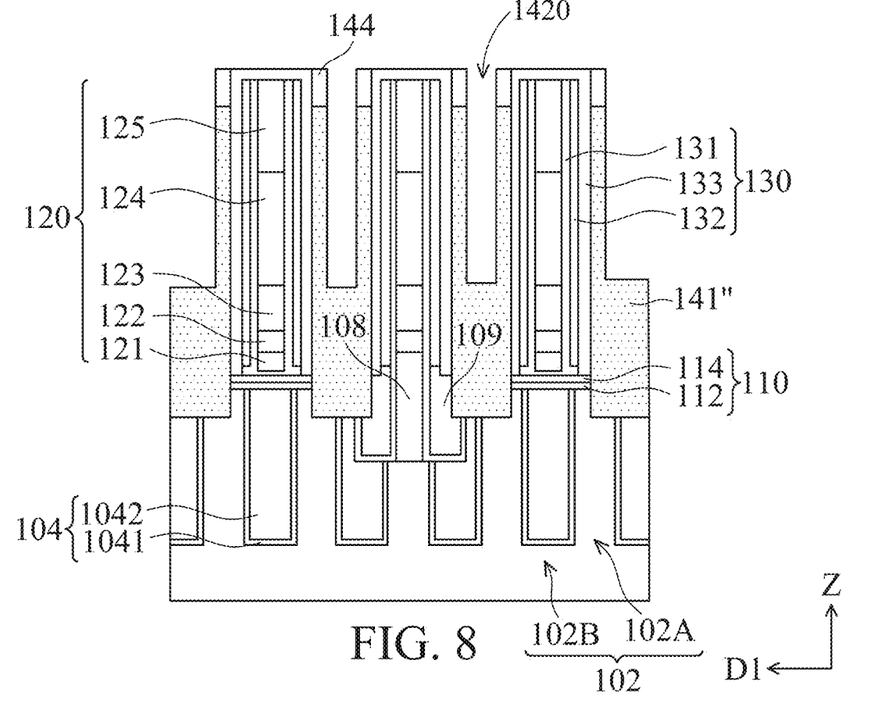

Next, as shown in FIG. 8, by the nitride layer 144 used as an etching mask, the semiconductor material 141' is etched by the etching process in order to form a semiconductor material 141" having a recess 1420. In FIG. 8, the semiconductor material 141" appears U-shaped and surrounds the recess 1420. At least a portion of the semiconductor material 141" will be converted into a metal silicide liner subsequently.

Figure 9:
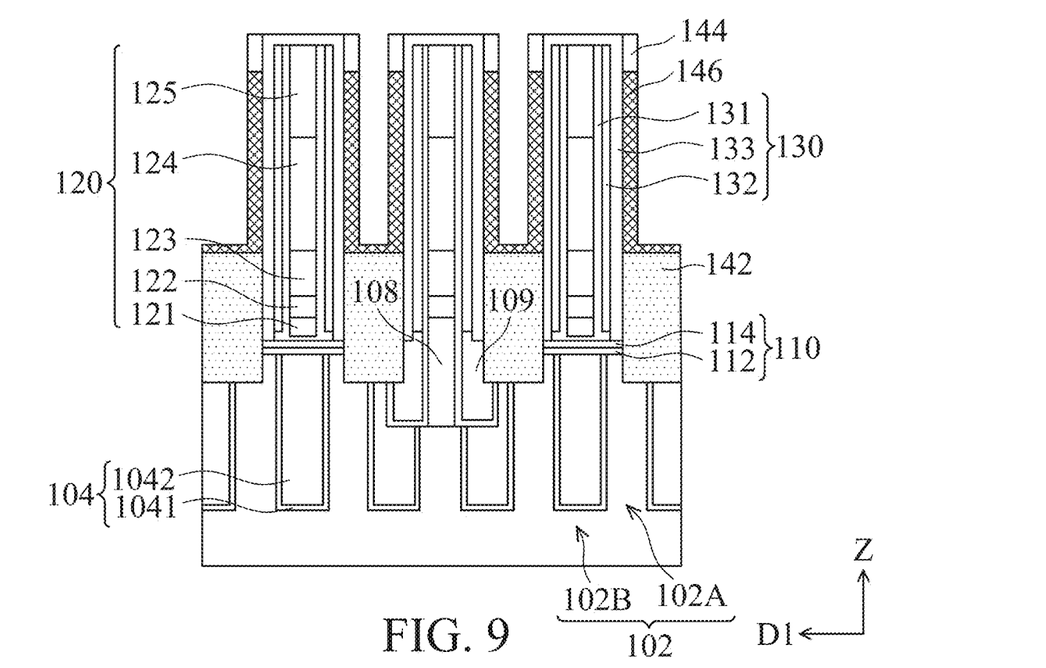

Next, as shown in FIG. 9, the semiconductor material 141" along the recess 1420 is converted into metal silicide liner 146 by silicidation process, thereby reducing the contact resistance with the subsequent metal plug (not shown).

Specifically, the semiconductor material 141" along the recess 1420 and directly under the nitride layer 144 is completely converted into the metal silicide liner 146. On the other hand, only a portion of the semiconductor material 141" under the recess is converted into the metal silicide liner 146, and the remaining semiconductor material 141" acts a semiconductor plug 142. In other words, the semiconductor material 141" through silicidation process is replaced by the semiconductor plug 142 and the metal silicide liner 146. The semiconductor plug 142 is in direct contact only with the lower sidewalls of the dielectric liner 130 while the metal silicide liner 146 is in direct contact only with the upper sidewalls of the dielectric liner 130.

The metal silicide liner 146 appears U-shaped and the top surface of the metal silicide liner 146 is in direct contact with the bottom surface of the nitride layer 144. The opposite sidewalls of the nitride layer 144 are level with the opposite sidewalls of the metal silicide liner 146 in order to effectively reduce the capacitance of the bit line. In other words, the width of the nitride layer 144 is substantially the same as that of the metal silicide liner 146.

The silicidation process includes first depositing a metal (such as cobalt) on the semiconductor plug 142, performing an annealing process on the metal, and then removing the unreactive portion of the metal by the wet etching process to form the metal silicide liner 146. In some embodiments, the metal silicide liner 146 includes cobalt silicon (CoSi).

Figure 10:
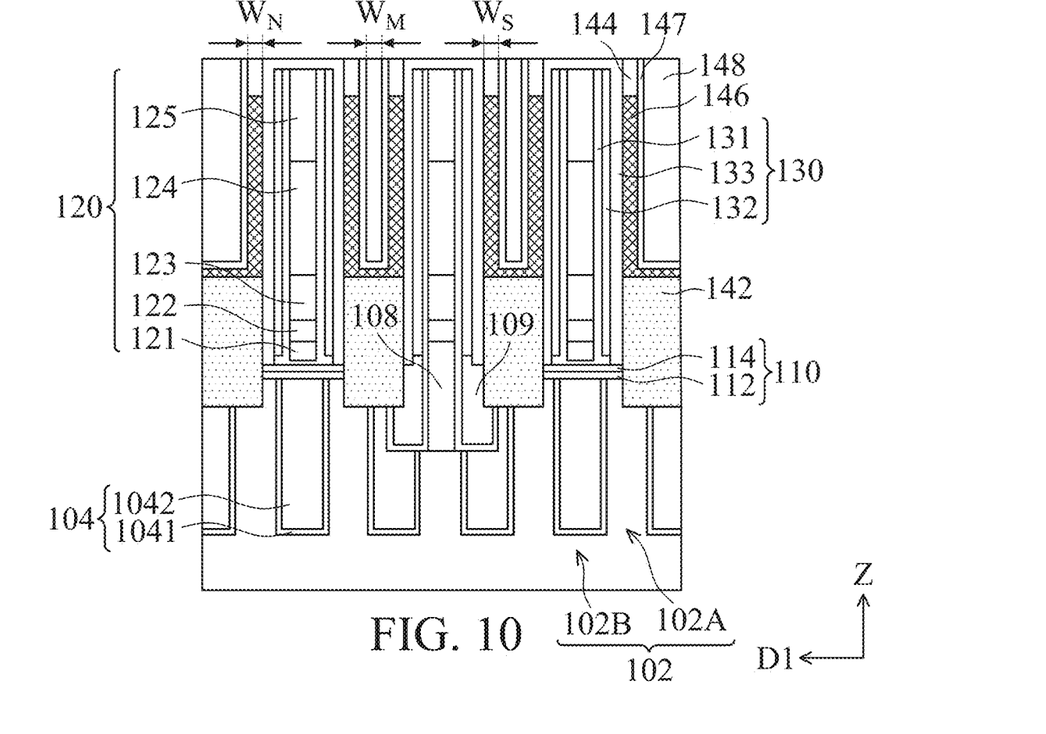

Next, an adhesive material layer is formed along the surface of the metal silicide 146 and a metal material is formed on the adhesive material layer in the deposition process. Then, the excessive portion is removed by the planarization process to form the adhesive layer 147 and the metal plug 148, and the structure shown in FIG. 10 is obtained. In some embodiments, the top surface of the adhesive layer 147, the top surface of the metal plug 148, and the top surface of the nitride layer 144 are level.

The adhesive layer 147 may increase the adhesion between the metal silicide liner 146 and the metal plug 148.

The adhesive layer 147 is formed along the sidewalls and the bottom of the metal silicide liner 146. Thus, the adhesive layer 147 appears U-shaped and surrounds the metal plug 148.

In some embodiments, the adhesive layer 147 is disposed between the metal silicide liner 146 and the metal plug 148. The adhesive layer 147 extends along the sidewalls of the nitride layer 144 and the sidewalls and the bottom of the metal silicide liner 146, and is in direct contact with the nitride liner 144 and the metal silicide liner 146. The adhesive layer 147 includes titanium (Ti) or titanium nitride (TiN) or the like.

The metal silicide liner 146 is disposed under the nitride layer 144, and the metal plug 148 is level with the nitride layer 144. The top surface of the metal silicide liner 146 is lower than the top surface of the metal plug 148.

The top portion of the metal plug 148 is surrounded by the nitride layer 144, and the bottom of the metal plug 148 is surrounded by the metal silicide liner 146.

Compared with the comparative embodiment where the metal silicide is disposed only on the bottom of the metal plug, the metal silicide provided by the present disclosure is further disposed on the sidewalls of the metal plug 148 to increase contact area, thereby reducing the resistance of the capacitor contact.

In some embodiments, the bottom surface of the metal plug 148 is higher than or equal to the top surface of the conductive layer 123 of the bit line 120. Also, the metal plug 148 is spaced apart from the conductive layer 123 by the metal silicide liner 146, thereby reducing the capacitance of the bit line 120 and the capacitor contact 140.

The ratio of the width WN of the nitride layer 144 and the width WM of the metal plug 148 is about 5%-20%. When it is greater than the above range, the contact area of the metal plug 148 and the subsequently formed capacitor is too small and higher contact resistance will be generated, thereby affecting the performance. When it is less than the above range, the nitride layer 144 is easily eroded during the patterning process, and thus the U-shaped metal silicide liner 146 is difficult to be defined.

The semiconductor substrate 102 under the bit line contact 108 has a doped region (not shown), which may act as a source electrode. The semiconductor substrate 102 under the capacitor contact 170 also has a doped region (not shown), which may act as a drain electrode. As shown in FIG. 1, in any of the active areas 102A extending in the third direction D3, the sequence of the arrangement shown as follows: the capacitor contact 140, the word line 106, the bit line contact 108, the word line 106, capacitor contact 140, which are used as a drain, a gate, a source, a gate, and a drain, respectively. In other words, two sets of transistor structures sharing the same source are included in the active region 102A. This way, the layout may be used more effectively, thereby lowering manufacturing costs.

Figure 11:
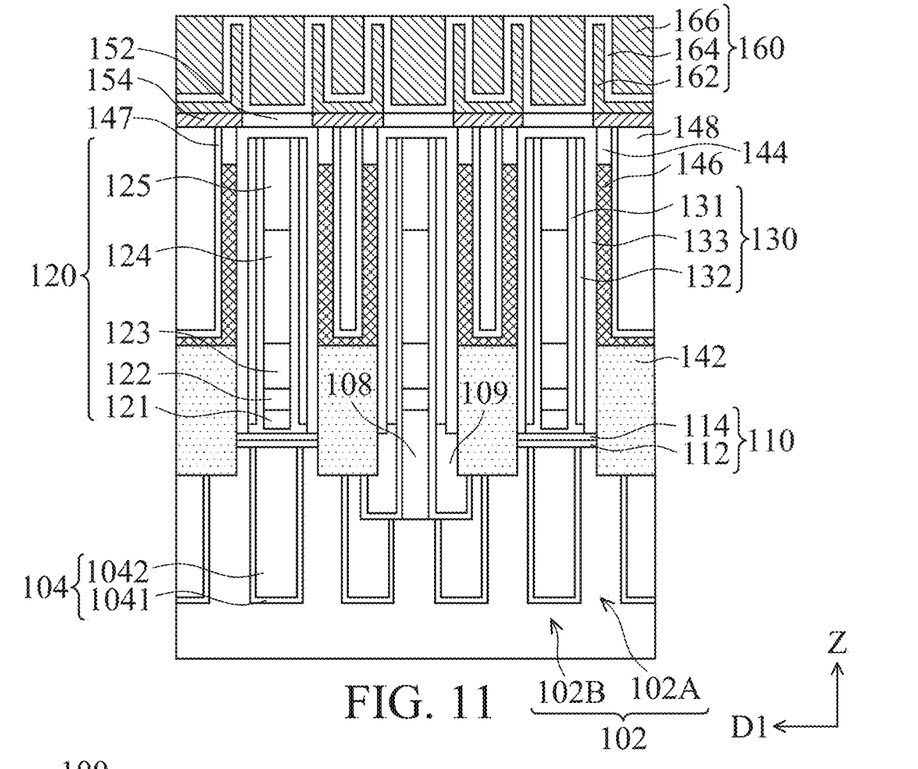

Next, referring to FIG. 11, a dielectric layer 152, a conductive barrier layer 154, a capacitor structure 160 are formed on the capacitor contact 140 and the bit line 120.

In some embodiments, the dielectric layer 152 and the conductive barrier 154 are arranged alternately. The conductive barrier layer 154 is disposed directly above the capacitor contact 140 and extends over the dielectric liner 130. The conductive barrier layer 154 includes a material that may block the penetration of the etching solution, such as tungsten or copper.

The capacitor structure 160 includes an electrode layer 162 and 166 and a dielectric layer 164 sandwiched therebetween. The electrode layer 162 is formed on the conductive barrier layer 154 and has a U-shaped cross-sectional profile. The dielectric layer 164 extends along the electrode layer 162 and the conductive barrier layer 154, and is a continuous film. It should be noted that the capacitor structure in FIG. 11 is only an example, and a person having an ordinary skill in the art may also apply a capacitor structure different from that in FIG. 11 to the capacitor contact 140.

The dielectric layer 164 may include silicon nitride ($Si_3N_4$), aluminum oxide ($Al_2O_3$), yttrium oxide ($Y_2O_3$), titanium oxide (TiO), hafnium dioxide ($HfO_2$), or zirconium dioxide ($ZrO_2$) and the like. The electrode layers 162 and 166 may include silicon germanium (SiGe), titanium, titanium nitride, tungsten nitride, tantalum, or tantalum nitride, or the like to reduce leakage current.

It should be noted that after the capacitor structure 160 is formed, additional components, such as a metal layer and a dielectric layer and the like, may still be formed to complete the fabrication of memory devices (such as DRAM).

In summary, in the embodiment of the present invention, the metal silicide liner extends along the sidewalls of the metal plug, which not only reduces the resistance of the capacitor contact, but also reduces the capacitance of the bit line.

Figure 12:
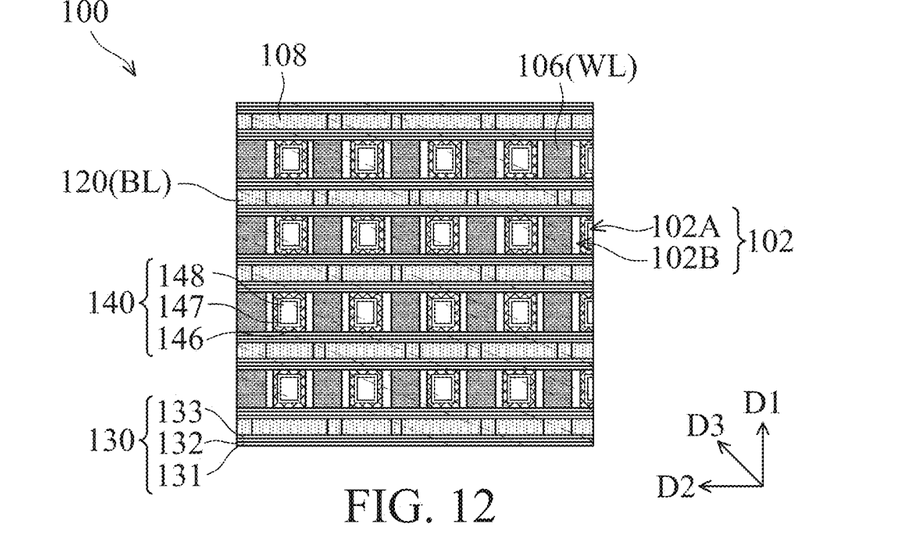

FIG. 12 illustrates a top view of a semiconductor memory structure according to some embodiments of the present disclosure. It should be noted that the top view illustrated in FIG. 12 only shows some of the elements to highlight the capacitive contact 140.

Specifically, in FIG. 12, the capacitor contact 140 includes the metal plug 148, the adhesive layer 147 and the metal silicide liner 146 both surrounding the metal plug 148. Also, the metal silicide liner 146 is located at an outer ring, and the adhesive layer 147 is located at an inner ring to prevent the metal plug 148 from peeling off the surface of the metal silicide liner 146.

Figure 13:
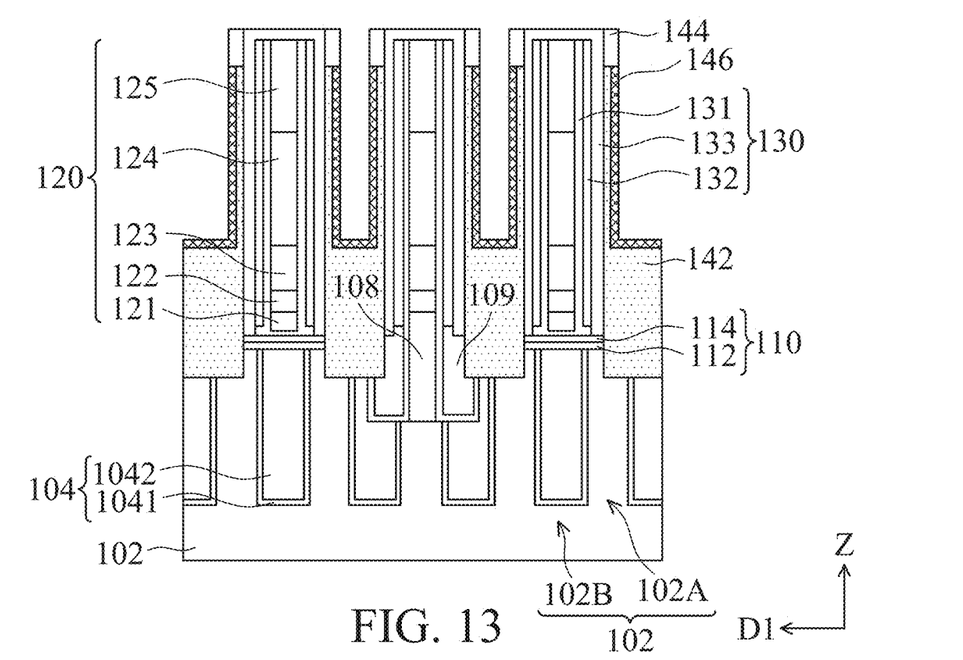
Figure 14:
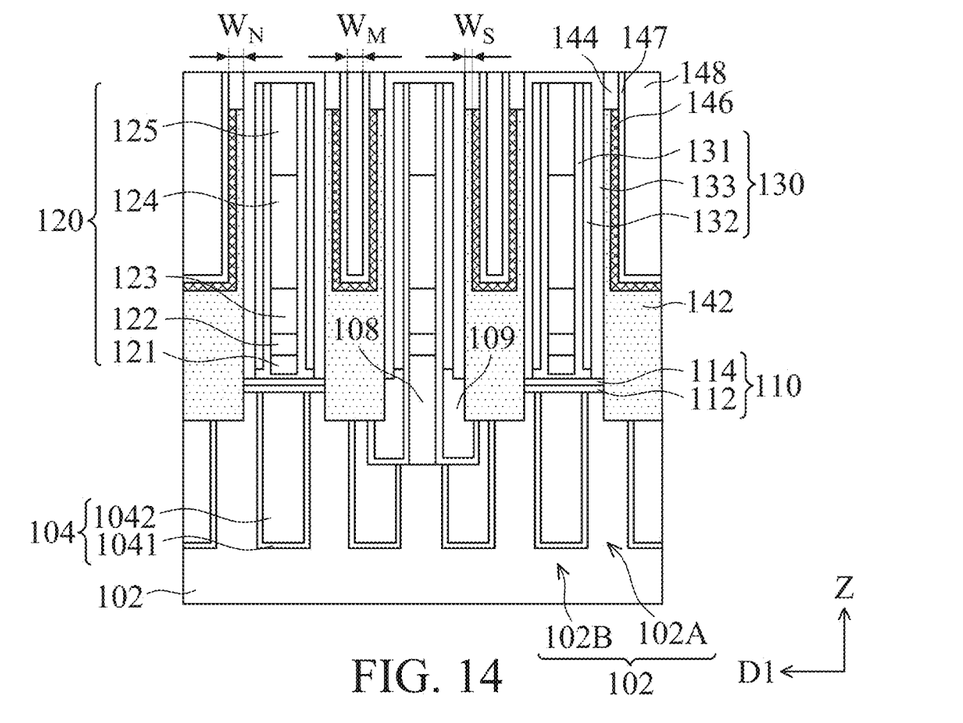

FIGS. 13-14 illustrate cross-sectional views of semiconductor memory structures at various stages according to other embodiments of the present disclosure.

Following FIG. 8, by widening the nitride layer 144 or shortening the time of the silicidation process, the semiconductor material 141" directly under the nitride layer 144 may be partially converted into a metal silicide liner 146, and the remaining semiconductor material 141" may be used as a semiconductor plug 142. In other words, the semiconductor plug 142 is U-shaped and surrounds the metal silicide liner 146, and the dielectric liner 130 is disposed on opposite sidewalls of the semiconductor plug 142.

The top surface of the semiconductor plug 142 is level with the top surface of the metal silicide liner 146 and is in direct contact with the bottom surface of the nitride layer 144. The sidewalls on opposite sides of the nitride layer 144 are respectively collinear with the semiconductor plug 142 and the metal silicide liner 146. That is, the sidewalls of the nitride layer 144 are respectively aligned with the sidewall of the semiconductor plug 142 and the sidewall of the metal silicide liner 146.

The semiconductor plug 142 further arranged on the sidewalls of the metal silicide liner 146 provided by the present disclosure may increase productivity.

Next, similar to the above process, the adhesive layer 147 and the metal plug 148 are formed, and the semiconductor memory structure as shown in FIG. 14 may be obtained.

The ratio of the width $W_S$ of the metal silicide liner 146 and the width $W_N$ of the nitride layer 144 is not less than 30%. For example, the ratio of the width $W_S$ and the width $W_N$ in FIG. 13 is 30% —less than 100%, or the ratio of the width $W_S$ and the width $W_N$ in FIG. 10 is 100%. In this way, the contact resistance may be reduced at a lower cost. Since the nitride layer 144 is used to define the shape of the semiconductor material (or the metal silicide liner), the above ratio is difficult to exceed 100%.

Figure 15:
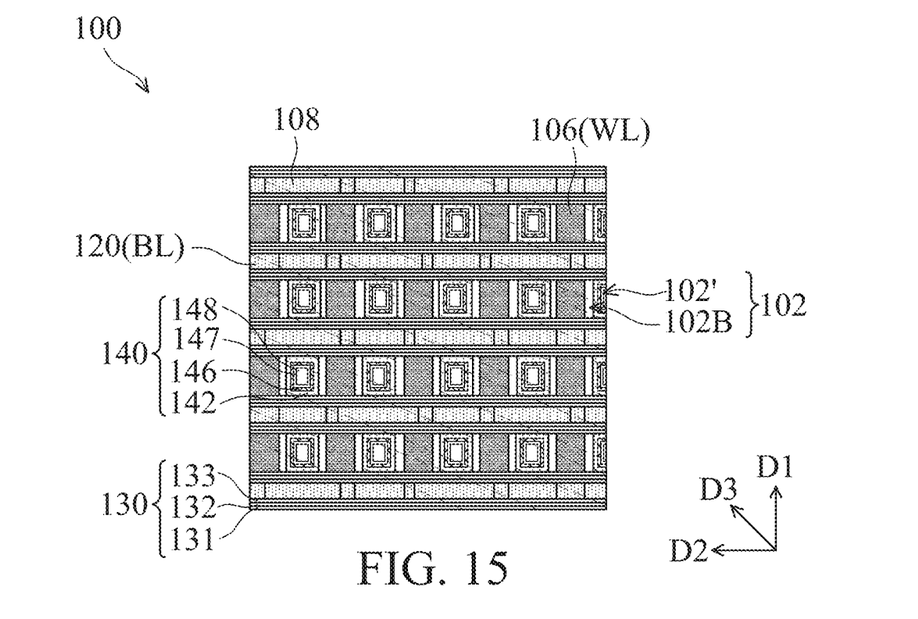

FIG. 15 illustrates a top view of a semiconductor memory structure according to other embodiments of the present disclosure. It should be noted that the top view illustrated in FIG. 15 only shows some of the elements to highlight the capacitive contact 140.

FIG. 15 is similar to FIG. 12, and the difference lies in the capacitive contact 140. Specifically, FIG. 15 shows that the capacitor contact 140 includes the metal plug 148, and the adhesive layer 147, the metal silicide liner 146, and the semiconductor plug 142 surrounding the metal plug 148. In addition, as the metal plug 148 is centered, the adhesive layer 147, the metal silicide liner layer 146, and the semiconductor plug 142 are disposed from the inside to the outside are respectively. That is, in the capacitor contact 140, the semiconductor plug 142 is at the outermost ring to reduce the capacitance of the bit line.

Figure 16:
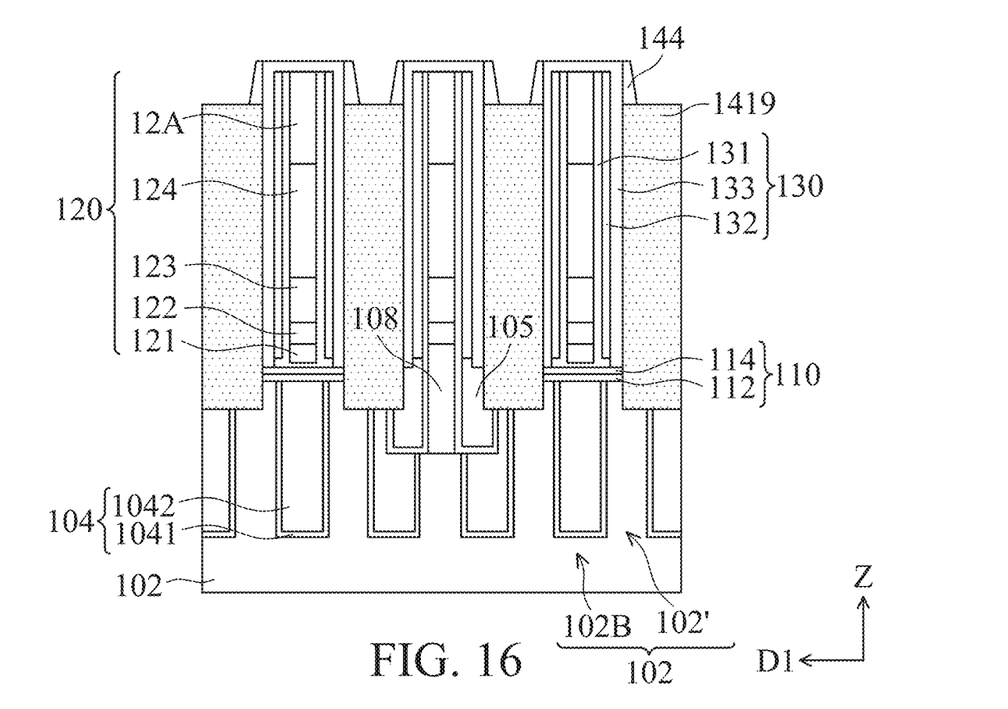
Figure 17:
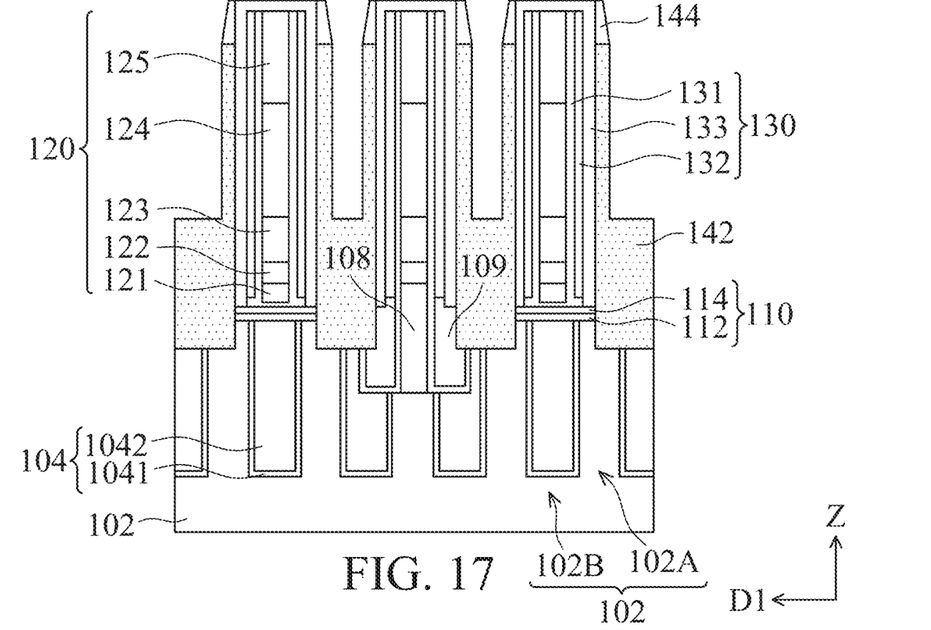
Figure 18:
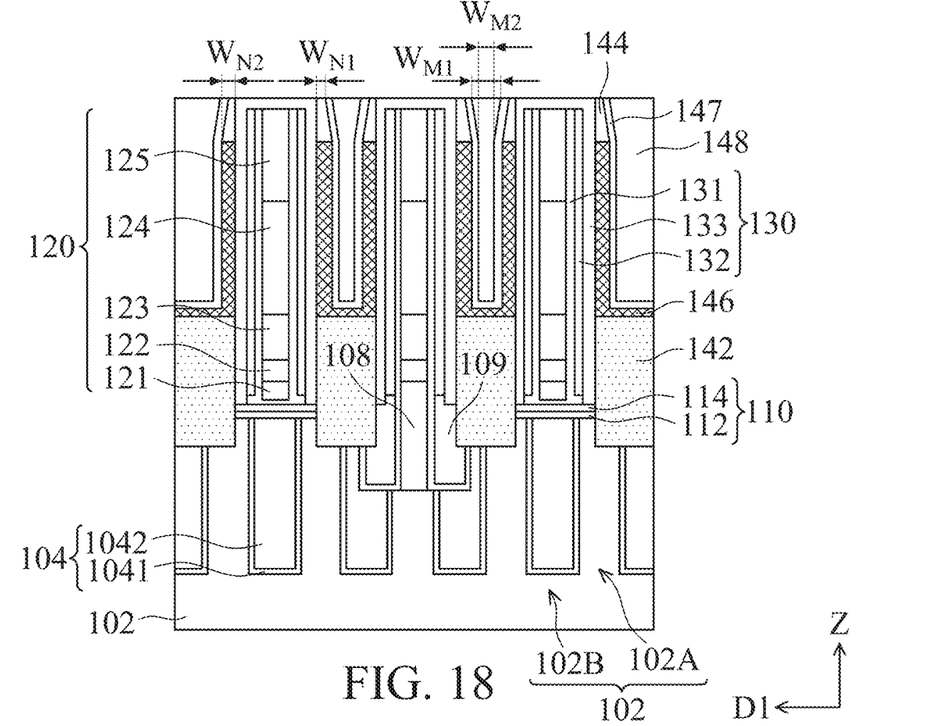

FIGS. 16-18 illustrate cross-sectional views of semiconductor memory structures at various stages according to some other embodiments of the present disclosure.

Following FIG. 6, in FIG. 16, the etching rate of the upper part of the nitride layer 144 is greater than the lower part by adjusting the etching conditions, so that the nitride layer 144 presents a trapezoidal shape with a narrow top and a wide bottom.

Next, FIG. 17 is similar to FIG. 8, using the bottom of the nitride layer 144 as an etching mask, the semiconductor material 141' is etched through an etching process to form a semiconductor plug 142 with a recess 1420.

Next, the metal silicide liner 146, the adhesive layer 147 and the metal plug 148 are formed by a process similar to the above, and the semiconductor memory structure as shown in FIG. 18 may be obtained. In FIG. 18, since the width $W_{N1}$ of the top surface of the nitride layer 144 is narrower than the width $W_{N2}$ of the bottom surface of the nitride layer 144, the width of the top $W_{M1}$ of the formed metal plug 148 is wider than the bottom $W_{M2}$ of the metal plug 148. In this way, the contact resistance between the metal plug 148 and the upper element (for example, a capacitor) is reduced.

In summary, in the embodiment of the present invention, the metal silicide liner extending to opposite sidewalls of the metal plug may reduce the resistance of the capacitor contact, and may also reduce the capacitance of the bit line. In addition, by forming the semiconductor plug surrounding the metal silicide liner, the capacitance of the bit line may be further reduced. In addition, the metal plug with non-uniform widths (for example, wide at the top and narrow at the bottom) may reduce the capacitance of the bit line while reducing the contact resistance with the upper elements.

Although the present invention is disclosed in the foregoing embodiments, it is not intended to limit the present invention. Those with ordinary skill in the technical field to which the present invention pertains can make some changes and modifications without departing from the spirit and scope of the present invention. Therefore, the scope of protection of the present invention shall be subject to those defined by the scope of the appended claims.

What is claimed is:

1. A semiconductor memory structure, comprising:
a semiconductor substrate;
a bit line disposed on the semiconductor substrate; and
a capacitor contact disposed on a side of the bit line, wherein the capacitor contact comprises:
a semiconductor plug disposed on the semiconductor substrate;
a metal plug disposed on the semiconductor plug;
a metal silicide liner extending along sidewalls and a bottom of the metal plug, wherein a top surface of the metal silicide liner is lower than a top surface of the metal plug; and
a nitride layer disposed on the metal silicide liner, wherein the nitride layer surrounds a top portion of the metal plug.

2. The semiconductor memory structure as claimed in claim 1, wherein a top surface of the nitride layer is level with the top surface of the metal plug.

3. The semiconductor memory structure as claimed in claim 1, wherein a sidewall of the nitride layer is level with a sidewall of the metal silicide liner.

4. The semiconductor memory structure as claimed in claim 1, wherein a sidewall of the nitride layer is level with a sidewall of the semiconductor plug.

5. The semiconductor memory structure as claimed in claim 1, further comprising a dielectric liner disposed between the bit line and the capacitor contact, wherein a top surface of the nitride layer is level with a top surface of the dielectric liner.

6. The semiconductor memory structure as claimed in claim 5, wherein the metal silicide is in direct contact with the dielectric liner.

7. The semiconductor memory structure as claimed in claim 5, wherein the nitride layer is disposed between the dielectric liner and the metal plug, and the nitride layer is in direct contact with the dielectric liner.

8. The semiconductor memory structure as claimed in claim 1, further comprising an adhesive layer disposed between the metal silicide liner and the metal plug.

9. The semiconductor memory structure as claimed in claim 8, wherein the adhesive layer surrounds the metal plug.

10. The semiconductor memory structure as claimed in claim 8, wherein the adhesive layer is U-shaped and is in direct contact with the nitride layer and the metal silicide liner.

11. The semiconductor memory structure as claimed in claim 8, wherein a top surface of the adhesive layer is level with the top surface of the metal plug.

12. The semiconductor memory structure as claimed in claim 1, wherein the semiconductor plug is U-shaped and surrounds the metal plug.

13. The semiconductor memory structure as claimed in claim 1, wherein in a cross-sectional view, a ratio of a width of the metal silicide liner and a width of the nitride layer is 30%-100%.

14. The semiconductor memory structure as claimed in claim 1, wherein in a cross-sectional view, a ratio of a width of the nitride layer and a width of the metal plug is 5%-20%.

15. The semiconductor memory structure as claimed in claim 1, wherein a top surface of the semiconductor plug is level with the top surface of the metal silicide liner.

16. The semiconductor memory structure as claimed in claim 1, wherein the semiconductor plug is further disposed on a sidewall of the metal silicide liner.

17. The semiconductor memory structure as claimed in claim 1, wherein the semiconductor plug is in direct contact with the nitride layer.

18. The semiconductor memory structure as claimed in claim 1, wherein the bit line comprises a conductive layer, and a top surface of the conductive layer is lower than or equal to a bottom surface of the metal plug.

19. The semiconductor memory structure as claimed in claim 1, wherein a width of a top portion of the metal plug is greater than a width of a bottom portion of the metal plug.

20. The semiconductor memory structure as claimed in claim 1, wherein the semiconductor plug is doped polycrystalline silicon, and the metal silicide liner is cobalt silicide.

\* \* \* \* \*